United States Patent [19]

Vasquez et al.

[11] Patent Number: 5,578,841
[45] Date of Patent: Nov. 26, 1996

[54] VERTICAL MOSFET DEVICE HAVING FRONTSIDE AND BACKSIDE CONTACTS

[75] Inventors: Barbara Vasquez, Austin, Tex.; Irenee M. Pages, Tolosane, France; E. James Prendergast, Phoenix, Ariz.

[73] Assignee: Motorola, Inc., Schaumburg, Ill.

[21] Appl. No.: 573,979

[22] Filed: Dec. 18, 1995

[51] Int. Cl.[6] .................. H01L 27/148; H01L 29/768; H01L 29/80; H01L 23/48

[52] U.S. Cl. .................. 257/220; 257/236; 257/242; 257/263; 257/778

[58] Field of Search .................. 257/213, 220, 257/236, 242, 263, 278, 302, 341, 734, 737, 738, 778, 780

[56] References Cited

U.S. PATENT DOCUMENTS

| | | |
|---|---|---|
| 5,045,902 | 9/1991 | Bancal . |
| 5,119,162 | 6/1992 | Todd et al. . |
| 5,273,615 | 12/1993 | Asetta et al. . |
| 5,283,454 | 2/1994 | Cambou . |
| 5,407,866 | 4/1995 | Sellers . |
| 5,413,952 | 5/1995 | Pages et al. . |

Primary Examiner—Carl Whitehead, Jr.
Attorney, Agent, or Firm—George C. Chen; Joe E. Barbee

[57] ABSTRACT

A multiple output, vertical MOSFET device (11) with improved electrical performance and thermal dissipation is integrated with an additional semiconductor device or semiconductor circuit (18) on a single semiconductor substrate (34). The method of making the vertical MOSFET device (11) involves thinning the semiconductor substrate (34) after fabricating the vertical MOSFET device (11) and the semiconductor circuit (18) to reduce the vertical component of electrical and thermal resistance and to increase the thermal dissipation efficiency. Electrical performance is improved by thinning the semiconductor substrate (34) and by providing a low resistivity, patterned metal buried layer. Thermal management is enhanced by using flip chip bumps (24) to dissipate heat from a top surface (31) of the semiconductor substrate (34) and by using the patterned buried metal layer (26) to dissipate heat from a bottom surface (32) of the semiconductor substrate (34).

16 Claims, 1 Drawing Sheet

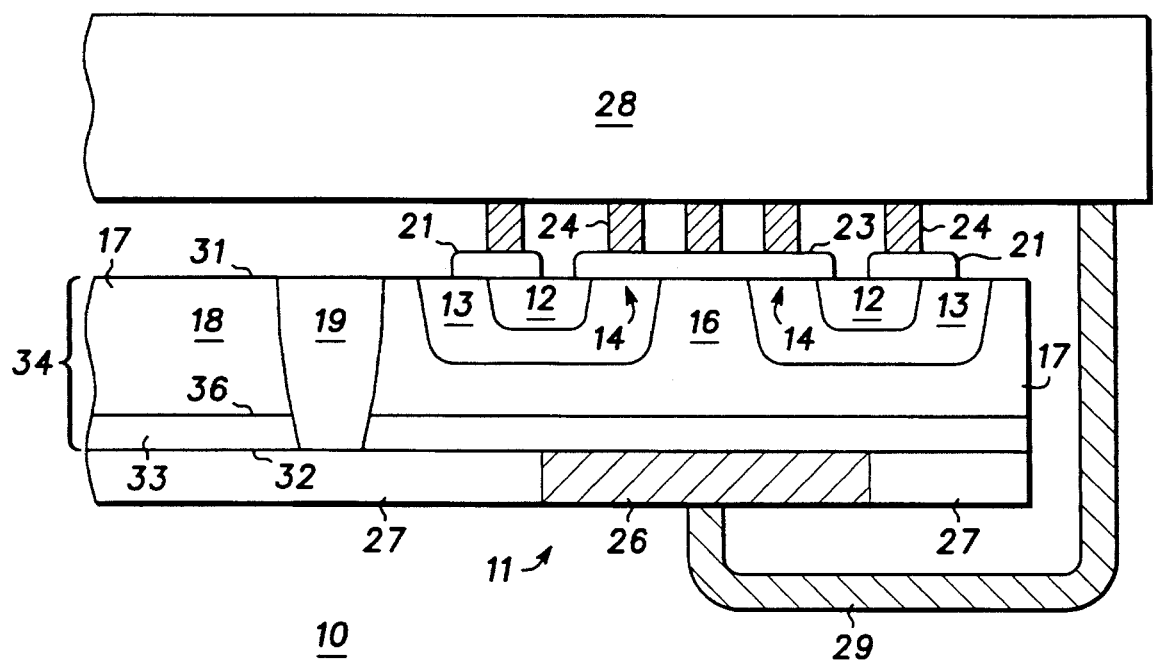

VERTICAL MOSFET DEVICE HAVING FRONTSIDE AND BACKSIDE CONTACTS

BACKGROUND OF THE INVENTION

This invention relates, in general, to thermal dissipation and electrical conductivity in semiconductor devices and, more particularly, to a vertical metal-oxide-semiconductor field effect transistor (MOSFET) device with improved thermal dissipation and lower resistivity to the flow of electrical current.

Integrating power transistors and other circuitry including complimentary MOSFETs (CMOS), bipolar and CMOS (BiCMOS), or bipolar transistors on a single semiconductor chip is a rapidly growing technology. The power transistors typically used in such an integration scheme are vertical MOSFET devices, which conventionally utilize a doped buried layer coupled to a drain contact on a top-side of the semiconductor chip. These vertical MOSFET devices with top-side drain, gate, and source contacts are known as up-drain "T" MOSFETs or up-drain TMOS. The electrical performance of the doped buried layer in up-drain TMOS devices is limited by the resistivity of the doped silicon layer that is used for the doped buried layer.

Another type of vertical MOSFET device typically used in the above mentioned integration schemes has a drain contact covering the entire bottom or backside of the semiconductor chip while the gate and source contacts are on the top-side of the semiconductor chip. However, this conventional backside drain contact limits the operation of the vertical MOSFET device to a single output device.

Accordingly, a need exists for an integration scheme that combines at least one vertical power MOSFET device with other circuitry on a single semiconductor chip. The vertical power MOSFET device should be a multiple output device, and the integration scheme including the vertical power MOSFET device should have efficient thermal dissipation and should have a simple method of manufacture.

BRIEF DESCRIPTION OF THE DRAWING

The single FIGURE depicts an enlarged cross-sectional view of a multiple output vertical MOSFET device coupled to an assembly substrate in accordance with the present invention.

DETAILED DESCRIPTION OF THE DRAWING

Turning to the drawings for a more detailed description, the single figure depicts an enlarged cross-sectional view of a multiple output vertical MOSFET device coupled to an assembly substrate in accordance with the present invention. An electronic device 10 includes a vertical transistor or vertical MOSFET device 11 in a semiconductor substrate 34. Vertical MOSFET device 11 is electrically coupled to an assembly substrate 28 by a wire bond wire 29 and flip chip bumps 24. Assembly substrate 28 can be a circuit board, another semiconductor substrate, a leadframe, or the like. Assembly substrate 28 has a conductive wiring pattern (not shown) coupled to flip chip bumps 24 and wire bond wire 29 to provide proper electrical biasing to operate vertical MOSFET device 11 and to provide thermal paths for heat removal from vertical MOSFET device 11.

Having opposite surfaces or sides 31 and 32, semiconductor substrate 34 comprises, but is not limited to, silicon or germanium. An embodiment of a process for fabricating vertical MOSFET device 11 involves growing a doped epitaxial layer 17 over a surface 36 of a semiconductor substrate 33. Epitaxial layer 17 preferably ranges from approximately 5–100 microns in thickness and has a first conductivity type. As illustrated in the single figure, semiconductor substrate 34 comprises epitaxial layer 17 over semiconductor substrate 33. In an alternative embodiment, semiconductor substrate 34 is comprised solely of semiconductor substrate 33 or solely of epitaxial layer 17.

Regions 13 are provided in epitaxial layer 17 and have a second conductivity type. Regions 12, which are subsequently provided within region 13, have the first conductivity type and have a higher doping concentration compared to regions 13. The first conductivity type can be p-type, and the second conductivity type can be n-type, or vice-versa. Regions 12 and 13 can be formed by one of several different approaches including, for example, diffusion, ion implantation and anneal, or patterned silicon etching and selective epitaxial regrowth.

Regions 12 represent the source regions of vertical MOSFET device 11. Having a similar conductivity type as regions 12, region 16 represents the drain region of vertical MOSFET device 11. Region 12 or drain region 16 can have the same doping concentration as epitaxial layer 17. Portions 14 of regions 13 represent the channel regions of vertical MOSFET device 11. Portions or channel regions 14 separate source regions 12 from drain region 16.

Gate and source contacts are subsequently formed over regions 14 and 12, respectively. Gate electrode 23 is formed over channel regions 14 and preferably comprises doped polysilicon or other conductive materials such as, for example, silicide, refractory metal, aluminum, or other metals over a thin insulating layer such as oxide. If gate electrode 23 is comprised of doped polysilicon, it has the first conductivity type of source regions 12 and drain region 16. Gate electrode 23 modulates the voltage potential across channel regions 14 to control the current flow between source regions 12 and drain region 16. Depending upon a desired configuration, gate electrode 23 can extend over a portion of source regions 12 as depicted in the single FIGURE. In an undepicted alternative embodiment, a separate gate electrode 23 can be fabricated for each channel region 14.

Source electrodes 21 are electrically conductive structures formed over portions of source regions 12. Source electrodes 21 bias source regions 12 to operate vertical MOSFET device 11. As portrayed in the single figure, source electrodes 21 are adjacent to, but separated from, gate electrode 23. In a preferred embodiment, source electrodes 21 extends over a portion of regions 13 as portrayed in the single figure.

To convert vertical MOSFET device 11 from a transistor to a diode in an alternative embodiment, source electrodes 21 and gate electrode 23 are electrically shorted together. Another alternative embodiment of the present invention uses a single source region (not shown) with a single channel region (also not shown). In this undepicted alternative embodiment, a single source electrode is preferably used to bias the single source region.

During formation of vertical MOSFET device 11, additional semiconductor devices or circuits can be simultaneously fabricated in semiconductor substrate 34 by conventional processes known in the art. An additional semiconductor device or semiconductor circuit 18 is isolated from vertical MOSFET device 11 by an isolation region 19 which can be formed using ion implantation, diffusion through a patterned masking layer, or other isolation techniques including, but not limited to, local oxidation of silicon (LOCOS) or trench isolation. In a preferred embodiment, isolation region 19 extends through epitaxial layer 17 and penetrates into a portion of semiconductor substrate 33 as illustrated in the single figure.

The subsequent processing steps that form multi-layer metal interconnect structures (not shown) above the device electrodes on semiconductor substrate 34 use techniques commonly known in the art.

After fabrication of semiconductor circuit 18 and vertical MOSFET device 11, a passivation layer (not shown) can be deposited over surface 31 to protect and passivate semiconductor substrate 34. Subsequently, flip chip bumps 24 are formed over and electrically coupled to gate electrode 23 and source electrode 21. Flip chip bumps are also formed over additional contact pads (not shown) electrically coupled to semiconductor circuit 18. Depending upon the size of the electrodes, a single flip chip bump or several flip chip bumps can be formed on gate electrode 23 and source electrode 21. As mentioned previously, flip chip bumps 24 are used to electrically couple vertical MOSFET device 11 to assembly substrate 28.

In addition to providing electrical coupling, flip chip bumps 24 are also used to remove heat from vertical MOSFET device 11. In particular, flip chip bumps 24 are used to dissipate heat from surface 31 of semiconductor substrate 34. While conventional flip chip bumps are typically 125–175 microns wide and have a pitch of about 250 microns, flip chip bumps for thermal dissipation are preferably smaller in size and pitch compared to conventional flip chip bumps. For example, flip chip bumps 24 of the present invention are preferably about 15–30 microns wide and have a pitch of about 40 microns. Flip chip bumps 24 preferably comprise materials including, but not limited to, copper, lead, or gold studs with or without solderable metals such as tin, lead, silver, or indium. In the absence of solderable metal, the bumps may be connected to the assembly substrate by one of several conductive adhesive materials.

Conventional flip chip technology places flip chip bumps on bonding pads which may be located away from but are electrically coupled to electrodes of a semiconductor device. In essence, the layout of the chip remains the same as or substantially similar to standard wire bonded technology with the exception that flip chip bumps replace the wire bond wires. However, as depicted in the single figure, flip chip bumps 24 are not formed on contact pads located away from the electrodes of vertical MOSFET device 11. For optimized heat transfer efficiency, flip chip bumps 24 are preferably fabricated directly on gate electrode 23 and source electrodes 21.

After formation of flip chip bumps 24, semiconductor substrate 34 is thinned without stressing semiconductor substrate 34 by using a technique similar to that described in U.S. Pat. No. 5,273,615, which issued to Asetta et al. on Dec. 28, 1993 and which is hereby incorporated herein by reference. Semiconductor substrate 34 is mounted on a handle or submount with surface 31 of semiconductor substrate 34 facing toward the submount and with surface 32 of semiconductor substrate 34 facing away from the submount. A chemical-mechanical polish is used on surface 32 to thin semiconductor substrate 34 to a preferred thickness plus an additional 150–200 microns. The thinning process is completed by using a wet etch to remove the excess 150–200 microns of semiconductor substrate 34 and to achieve the preferred thickness of approximately 20–100 microns for semiconductor substrate 34. The wet etchant used to remove the final 150–200 microns of semiconductor substrate 34 preferably comprises the following chemistries: hydroflouric acid, nitric acid, phosphoric acid, and sulfuric acid. Depending upon the thickness of epitaxial layer 17 and the final desired thickness of semiconductor substrate 34 after thinning, semiconductor substrate 34 can be comprised of a combination of substrate 33 and epitaxial layer 17 as portrayed in the single figure, or alternatively, semiconductor substrate 34 can be comprised of only epitaxial layer 17 and not of semiconductor substrate 33. Semiconductor substrate 33 and epitaxial layer 17 have a preferred combined thickness of 20–100 microns.

Alternatively, if device structures are fabricated on polished substrates without epi, semiconductor substrate 34 can be comprised only of semiconductor substrate 33.

After the thinning process, approximately 1 micron of metal is preferably formed on surface 32 of semiconductor substrate 34 and is patterned to form a patterned metal buried layer, drain electrode, or backside metal 26. The deposition process of backside metal 26 can include electroplating or sputtering, and the patterning of backside metal 26 can include using the wafer flat or notch as an alignment mark for the backside etch mask. The deposition and patterning process of backside metal 26 is performed while semiconductor substrate 34 remains mounted on the submount that was used for the thinning process described above. Keeping semiconductor substrate 34 mounted on the submount provides mechanical support for thinned semiconductor substrate 34 during subsequent processing.

A passivation layer 27 is then formed over surface 32 to protect surface 32 of semiconductor substrate 34. Passivation layer 27 preferably comprises polyimide, oxide, nitride, or the like. In accordance with the present invention, an alternative embodiment first deposits passivation layer 27 over surface 32 of semiconductor substrate 34, patterns a photoresist layer over passivation layer 27, subsequently etches passivation layer 27, and then deposits and etches backside metal 26. Alternatively, if photoimagable polymers are used, the passivation layer may be patterned without the requirement for photoresist.

Since all required high temperature processing steps have been completed prior to the deposition of backside metal 26, highly conductive materials such as, for example, copper or aluminum can be used to selectively contact the drain regions of different vertical MOSFETs. Therefore, by depositing backside metal 26 after the high temperature processing steps, backside metal 26 is not limited to refractory metals as in the prior art. Using aluminum or copper for backside metal 26 lowers the sheet resistance and contact resistance of backside metal 26 compared to conventional doped silicon or refractory backside metals and improves the electrical performance of vertical MOSFET device 11.

In an embodiment wherein isolation region 19 represents a p-n junction used for device isolation, backside metal 26 can be used to selectively contact a portion of isolation region 19.

Finally, semiconductor substrate 34 is sawed into individual semiconductor chips. The individual semiconductor chips can be flip chip mounted onto assembly substrate 28 as illustrated in the single figure. To provide electrical coupling to backside metal 26, which serves as the drain electrode for vertical MOSFET device 11, wire bond wire 29 electrically couples backside metal 26 to assembly substrate 28. In this manner, gate electrode 23, source electrodes 21, and drain electrode 26 can all be independently biased from assembly substrate 28 for proper operation of vertical MOSFET device 11.

In addition to providing electrical biasing for vertical MOSFET device 11, backside metal 26 also serves as a thermal conduction path and a large thermal capacitor to dissipate heat from surface 32 of semiconductor substrate 34. The thermal capacitor or backside metal 26 modulates thermal transients, and the improved thermal conduction path provided by backside metal 26 minimizes the steady state temperature of operation. Because vertical MOSFET device 11 has a first thermal path along surface 31 of semiconductor substrate 34 and a second thermal path from surface 31 to opposite surface 32, heat is generated along both surfaces 31 and 32 of semiconductor substrate 34. Because semiconductor substrates are poor thermal conductors relative to metals, thinning semiconductor substrate 34 to the preferred thickness of 20–100 microns significantly increases the thermal dissipation efficiency of vertical MOSFET device 11. Flip chip bumps 24 remove heat from surface 31, and backside metal 26 removes heat from surface 32. By removing heat from semiconductor substrate 34 from two opposite surfaces, both steady-state and transient heating conditions can be efficiently managed.

In accordance with the present invention, two features, taken together, enable the fabrication of multiple output, vertical power devices with improved thermal and electrical properties. The features are the following: (1) the substantial thinning of a semiconductor substrate after device formation and prior to backside metal deposition and patterning and (2) a patterned backside metal comprised of a low resistance material. The metal buried layer or backside metal 26 improves the electrical performance, simplifies processing, and further improves heat dissipation efficiency of vertical MOSFET device 11. A patterned backside metal 26 provides a multiple output device for electronic device 10, and an unpatterned backside metal 26 provides a single output device for electronic device 10. Substantial semiconductor substrate thinning after device formation substantially reduces the substrate series resistance compared to the prior art. The improved electrical and thermal performance resulting from using patterned backside metal 26 is due to the relatively low electrical and thermal resistance of backside metal 26 and is also due to the close vertical proximity between backside metal 26 and the semiconductor device or devices on the frontside of semiconductor substrate 34. Additionally, the use of drain electrode or patterned backside metal 26 reduces contact resistance compared to that of a conventional doped buried layer.

While the invention has been particularly shown and described with reference to preferred embodiments, it will be understood by those skilled in the art that changes in form and detail may be made without departing from the spirit and scope of the invention. For instance, backside metal 26 may be a conductive epoxy containing metallic flakes. Additionally, an alternative embodiment of the present invention provides a process for fabricating up-drain or top-side contact, multiple output power devices. In other words, for a transistor with source, gate, and drain electrodes on the same surface of a semiconductor chip, backside metal 26 of the present invention can be substituted for a conventional doped semiconductor buried layer to reduce electrical resistance of the buried layer relative to the conventional doped semiconductor buried layer. As described above, the lower resistivity of backside metal 26 improves the electrical performance of the transistor. In addition, the thermal performance of the semiconductor die is improved due to the reduced thermal resistance and increased thermal capacitance provided by backside metal 26.

In another alternative embodiment, the up-drain transistor could be assembled in a conventional wire bonded package or flip chip package after passivating the buried metal layer. Yet another alternative embodiment of the present invention can be applied to the fabrication of single output, vertical devices. The single output, vertical device would not require backside passivation unless flip chip assembly were used. The single output, vertical device could be assembled on a conventional single chip package or be bumped and flip-chip assembled in a manner similar to that portrayed in the single figure.

In the present invention, the buried layer can be either a doped semiconductor layer or a metal buried layer. The implementation of a patterned metal buried layer of the present invention reduces electrical resistance, reduces thermal resistance, and improves thermal capacity. These three parameters are key attributes for power devices. The lower electrical resistance means reduced power losses in the device. The lower thermal resistance means reduced temperature of operation. The higher thermal capacity means higher power transients can be sustained. In addition, backside metal 26 can be patterned and, therefore, permits multiple output operation of vertical MOSFET device 11. Conventional vertical up-drain MOSFETs are patterned only on the top-side of the chip. By patterning on both the top and bottom sides of a semiconductor chip, the present invention facilitates chip area reductions by as much as thirty percent by eliminating top-side drain contacts.

Therefore, in accordance with the present invention, it is apparent there has been provided an improved vertical MOSFET device which overcomes the disadvantages of the prior art. Using a semiconductor substrate thinned after device formation, a patterned backside metal, and flip chip bumps, the thermal and electrical performance of integrated vertical MOSFET devices is improved. Furthermore, moving the drain contacts to the backside of the die drives a reduction in the overall die size which eliminates the prior art requirement of using deep junctions to contact the buried layer.

The device performance and reliability of the present invention are improved due to reduced transient and steady state operating temperatures. Finally, the fabrication process of the present invention is simplified, and the performance of a vertical MOSFET device is enhanced relative to the prior art high temperature bonded wafer approach for integrating a refractory metal buried layer.

We claim:
1. A vertical MOSFET device, comprising:
   a semiconductor substrate with a first side and a second side opposite the first side;
   an epitaxial layer over the first side, wherein the epitaxial layer has a source region, a drain region, and a channel region which couples the source region to the drain region, wherein the semiconductor substrate and the epitaxial layer have a combined thickness of approximately 20–100 microns;
   a source electrode electrically coupled to the source region, the source electrode located over the first side of the semiconductor substrate;
   a gate electrode over the channel region, the gate electrode located over the first side of the semiconductor substrate;
   a drain electrode coupled to the second side of the semiconductor substrate;
   flip chip bumps over the source electrode and the gate electrode; and
   an assembly substrate electrically coupled to the flip chip bumps.

2. The vertical MOSFET device according to claim 1, further comprising a wire bond wire to electrically couple the drain electrode to the assembly substrate, wherein the drain electrode is patterned.

3. The vertical MOSFET device according to claim 2, wherein the semiconductor substrate comprises silicon and wherein the drain electrode is selected from the group consisting of aluminum or copper.

4. The vertical MOSFET device according to claim 1, wherein the drain electrode is unpatterned.

5. An electronic device with improved heat dissipation, the electronic device comprising:
 a semiconductor substrate with a first side and a second side which are opposite to each other, wherein the semiconductor substrate has a source region, a drain region, and a channel region, wherein the channel region couples the source region to the drain region, and wherein the semiconductor substrate is approximately 20 to 100 microns thick;
 a gate electrode over the channel region and located at the first side of the semiconductor substrate;
 a source electrode electrically coupled to the source region and located at the first side of the semiconductor substrate; and
 a buried metal layer coupled to the drain region, the buried metal layer selected from the group consisting of aluminum, copper, or conductive epoxy.

6. The electronic device according to claim 5, further comprising a semiconductor device in the semiconductor substrate, wherein the semiconductor substrate includes silicon.

7. The electronic device according to claim 5, further comprising a drain electrode coupled to the first side of the semiconductor substrate.

8. The electronic device according to claim 5, further comprising:
 an assembly substrate; and
 flip chip bumps electrically coupling the source electrode and the gate electrode to the assembly substrate.

9. The electronic device according to claim 8, further comprising a drain electrode coupled to the second side of the semiconductor substrate.

10. The electronic device according to claim 9, wherein the drain electrode is patterned and wherein the electronic device is a multiple output device.

11. The electronic device according to claim 9, wherein the drain electrode is unpatterned and wherein the electronic device is a single output device.

12. The electronic device according to claim 9 further comprising a wire bond wire to electrically couple the drain electrode to the assembly substrate.

13. A multiple output device with improved heat dissipation electrically coupled to an assembly substrate, the multiple output device comprising:
 a semiconductor substrate, wherein the semiconductor substrate has a first surface and a second surface opposite the first surface;
 a first region of a first conductivity type in the semiconductor substrate;
 a second region of a second conductivity type in the first region;
 a third region of the first conductivity type in the second region, wherein the second region separates the first region from the third region;
 a first electrode at the first surface over the third region and electrically coupled to the third region;
 a second electrode at the first surface and located over a portion of the second region to modulate a voltage potential of the portion of the second region to control current flow through the portion of the second region between the first region and the third region;
 a third electrode at the second surface of the semiconductor substrate to remove heat from the second surface of the semiconductor substrate;
 a first flip chip bump over the first electrode to electrically couple and to remove heat from the first surface of the semiconductor substrate to the assembly substrate;
 a second flip chip bump over the second electrode to electrically couple and to remove heat from the first surface of the semiconductor substrate to the assembly substrate; and
 a wire bond wire coupled to the third electrode to electrically couple the third electrode to the assembly substrate.

14. The multiple output device according to claim 13, wherein the third electrode is patterned.

15. The multiple output device according to claim 13, further comprising a semiconductor device in the semiconductor substrate with additional flip chip bumps over the first surface of the semiconductor substrate to couple the semiconductor device to the assembly substrate.

16. The multiple output device according to claim 15, wherein the semiconductor substrate is about 20 to 100 microns thick to improve heat dissipation from the semiconductor substrate.

\* \* \* \* \*